(12) United States Patent
Kodama et al.

(10) Patent No.: US 8,513,527 B2
(45) Date of Patent: Aug. 20, 2013

(54) SUPERCONDUCTING CIRCUIT, PRODUCTION METHOD OF SUPERCONDUCTING JOINTS, SUPERCONDUCTING MAGNET, AND PRODUCTION METHOD OF SUPERCONDUCTING MAGNET

(75) Inventors: Motomune Kodama, Hitachi (JP); Michiya Okada, Tsukuba (JP); Masaya Takahashi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 387 days.

(21) Appl. No.: 12/845,474

(22) Filed: Jul. 28, 2010

(65) Prior Publication Data

US 2011/0028327 A1    Feb. 3, 2011

(30) Foreign Application Priority Data

Jul. 29, 2009 (JP) .................................. 2009-176537

(51) Int. Cl.
*H01B 12/10* (2006.01)
*H01L 39/02* (2006.01)

(52) U.S. Cl.
USPC .......................... 174/125.1; 505/806; 505/951

(58) Field of Classification Search
USPC ............... 505/951, 806; 420/901; 174/21 R, 174/125.1
See application file for complete search history.

(56) References Cited

U.S. PATENT DOCUMENTS

| | | | |
|---|---|---|---|
| 4,907,338 A | 3/1990 | Thornton | |
| 5,231,366 A | 7/1993 | Haramaki et al. | |
| 5,374,320 A * | 12/1994 | Matsumoto et al. | 148/421 |
| 2012/0021915 A1* | 1/2012 | Kodama et al. | 505/162 |

FOREIGN PATENT DOCUMENTS

| | | |
|---|---|---|
| EP | 0 645 830 A1 | 3/1995 |
| EP | 1 276 171 A2 | 1/2003 |
| JP | 60-218808 A | 11/1985 |
| JP | 63-55875 A | 3/1988 |
| JP | 63-187507 A | 8/1988 |
| JP | 2-207471 A | 8/1990 |
| JP | 3-295207 A | 12/1991 |
| JP | 4-319280 A | 11/1992 |
| JP | 5-13117 A | 1/1993 |
| JP | 5-74507 A | 3/1993 |

(Continued)

OTHER PUBLICATIONS

Li et al "The microstructure of NbTi superconducting composite wire for ITER project", Physica C, 468(2008) 1840-1842.*

(Continued)

*Primary Examiner* — Mark Kopec
(74) *Attorney, Agent, or Firm* — Crowell & Moring LLP

(57) ABSTRACT

A superconducting circuit including a superconducting joint that joints a niobium titanium superconducting wire having a structure where a filament made of niobium titanium alloy is arranged in a matrix made of copper or copper alloy and other superconducting wire, in which a volume ratio or a surface density of an α-Ti precipitation in the niobium titanium alloy of the filament in the superconducting joint is smaller than the volume ratio or the surface density of the α-Ti precipitation in the niobium titanium alloy of the filament in the niobium titanium superconducting wire in a portion other than the superconducting joint.

8 Claims, 9 Drawing Sheets

Partial enlarged view of cross section of filament 18: Superconducting joint

21 α-Ti precipitation

(56) References Cited

FOREIGN PATENT DOCUMENTS

| | | |
|---|---|---|
| JP | 5-152045 A | 6/1993 |
| JP | 6-5345 A | 1/1994 |
| JP | 6-150993 A | 5/1994 |
| JP | 6-196241 A | 7/1994 |
| JP | 6-302429 A | 10/1994 |
| JP | 8-153563 A | 6/1996 |
| JP | 10-21976 A | 1/1998 |
| JP | 10-284152 A | 10/1998 |

OTHER PUBLICATIONS

Corresponding European Search Report (Form 1507N) dated Mar. 28, 2011 (Eight (8) pages).
Japanese Office Action dated Jan. 22, 2013 (four (4) pages).
European Search Report dated Feb. 1, 2013 (eight (8) pages).
Japanese Office Action dated Nov. 13, 2012 (five (5) sheets).

* cited by examiner

12(12a~12e)

18 Filament

Matrix

Partial enlarged view of cross section of filament 18: Superconducting wire 24   21 α-Ti precipitation Partial enlarged view of cross section of filament 18: Superconducting joint One-turn portion 22
12
13(23)

Comparative example 23
25 Space
18
14

SUPERCONDUCTING CIRCUIT, PRODUCTION METHOD OF SUPERCONDUCTING JOINTS, SUPERCONDUCTING MAGNET, AND PRODUCTION METHOD OF SUPERCONDUCTING MAGNET

CROSS REFERENCE TO RELATED APPLICATIONS

This application claims the foreign priority benefit under Title 35, United States Code, §119(a)-(d) of Japanese Patent Application No. 2009-176537, filed on Jul. 29, 2009, the contents of which are hereby incorporated by reference.

BACKGROUND OF THE INVENTION

1. Field of the Invention

The present invention relates to a superconducting circuit having superconducting joints and a production method of the superconducting joints, and further relates to a superconducting magnet provided with the superconducting circuit and a production method of the superconducting magnet.

2. Description of Related Art

A superconducting magnet is capable of generating a high intensity and low attenuation magnetic field. Therefore, the superconducting magnet is used for a nuclear magnetic resonance analysis equipment (hereinafter, referred to as NMR apparatus: Nuclear Magnetic Resonance apparatus) and a medical magnetic resonance diagnostic equipment (hereinafter, referred to as MRI apparatus: Magnetic Resonance Imaging apparatus). Especially, with respect to an apparatus utilizing a nuclear magnetic resonance phenomenon such as the NMR apparatus and the MRI apparatus, analytical sensitivity and imaging quality can be improved by increasing the magnetic field intensity and the magnetic field time stability. Then, application of the superconducting magnet, which is capable of generating a high intensity/low attenuation magnetic field, to these apparatuses is becoming a main stream.

A superconducting magnet generates a high intensity/low attenuation magnetic field under the persistent current mode by a large current flowing in a superconducting coil without supplying electric power from outside. However, the magnetic field slightly attenuates even in the persistent current mode. A loss in a superconducting joint that connects superconducting wires with each other is considered one of reasons for the magnetic field attenuation, and a method for jointing a superconducting wire has been proposed, for example, in U.S. Pat. No. 4,907,338 and JP H05-152045.

In U.S. Pat. No. 4,907,338, a method for jointing a superconducting wire having a structure where a filament made of niobium titanium (NbTi) is arranged in a matrix made of copper (Cu) is described. In the jointing method, the matrix on the end portion of the superconducting wire is replaced with tin (Sn), the tin is further replaced with lead-bismuth alloy (PbBi) that is a superconductor, and each end portion of the superconducting wire is inserted into a metal tube where melted lead-bismuth alloy is filled to joint the superconducting wire with each other.

In JP H05-152045, there is a description on a jointing method, where a matrix on the end portion of a superconducting wire is dissolved to expose a filament, and the exposed filament of the superconducting wire is inserted into a sleeve to be pressed together with the sleeve.

SUMMARY OF THE INVENTION

In the jointing method described in U.S. Pat. No. 4,907,338, a lead-bismuth alloy containing lead (Pb) is used. In recent years, a jointing method without using lead has been expected in consideration of environmental issues. The jointing method described in JP H05-152045 has been well known as a method without using lead. However, a superconducting joint using the jointing method described in JP H05-152045 is likely to induce a flux jumping which is an instability phenomenon specific to a superconducting wire. In the flux jumping, a temperature of the superconducting joint increases to cause a transition to the normal state, and thereby the flux jumping was considered to induce a quenching of the superconducting magnet in some cases.

Then, the reason why the flux jumping is likely to occur in the superconducting joint using the jointing method described in JP H05-152045 was studied.

In a superconducting wire having a structure where a filament made of niobium titanium is arranged in a matrix made of copper, the filament is a type II superconductor which generates a status that a magnetic flux penetrates inside the filament in the magnetic field, and due to this property, the superconducting state can be maintained even in a high intensity magnetic field. Therefore, during operation of the superconducting magnet, the magnetic flux penetrates inside the superconducting wire, while generating a magnetic flux distribution. Then, triggered by some disturbance, the magnetic flux distribution inside the superconducting wire fluctuates (the magnetic flux moves) to generate a heat, thereby resulting in increase in temperature of the filament (superconductor). Due to this temperature increase, a critical current density of the filament decreases, thereby the magnetic flux distribution inside the superconducting wire fluctuates (the magnetic flux moves) to generate another heat. Through this chain-reaction of the heat generation, a temperature of the superconducting wire is largely increased. A phenomenon of this temperature increase is the flux jumping.

In a superconducting plate having a thickness of 2a (m), a condition for not to generate the flux jumping under adiabatic condition is expressed by the following formula 1, as described in the book titled "Basics of Superconductor Applications" (published from SANGYO TOSHO PUBLISHING CO., LTD.).

$$\frac{\mu_0 J_c^2 a^2}{\gamma C(T_c - T_0)} < 3 \qquad \text{formula 1}$$

where, $\mu_0$: vacuum magnetic permeability (H/m), $J_c$: critical current density at operating temperature (A/cm$^2$), $\gamma$: density of niobium titanium alloy (kg/m$^3$), C: specific heat of niobium titanium alloy (J/kgK), $T_c$: critical temperature of niobium titanium alloy (K), $T_0$: operating temperature (K).

Meanwhile, formula 1 is based on a simplified model in comparison with structures of an actual superconducting wire and an actual superconducting joint. However, formula 1 may be applied qualitatively, and the following countermeasures for not to generate the flux jumping are derived.

Countermeasure 1: Thinning of a superconducting filament (thinning of a)

Countermeasure 2: Lowering of a critical current density of a superconducting filament (lowering of $J_c$)

Generally, with respect to a superconducting wire made of niobium titanium, niobium titanium alloy is divided into a plurality of fine filaments by a copper member to achieve the countermeasure 1.

On the other hand, in a superconducting joint using the jointing method described in JP H05-152045, it is supposed that an effective diameter of the filament is large because a plurality of filaments are arranged within a sleeve and pressure-welded with each other. Therefore, in the superconducting joint, it is supposed that the flux jumping is likely to occur in the superconducting wire.

In addition, generally, a superconducting coil is formed in a center portion of each superconducting wire, and a superconducting joint is formed at the end portion of the superconducting wire distant from the superconducting coil. The superconducting wire forming the superconducting coil is arranged in a high intensity magnetic field generated by the superconducting coil. On the other hand, since the superconducting joint is distant from the superconducting coil, magnetic field intensity at a position where the superconducting joint is placed is lower than that at a position where the superconducting wire forming the superconducting coil is placed. The critical current density $J_c$ of the filament depends on magnetic field intensity at a position where the filament is placed, and has a tendency to become large as the magnetic field intensity becomes lower. Therefore, the critical current density $J_c$ in the superconducting joint, where the magnetic field intensity is low, is higher than the critical current density $J_c$ in the superconducting coil where the magnetic field intensity is high. Applying this fact to the countermeasure 2, it was supposed that the critical current density $J_c$ of the filament in the superconducting joint became higher than that of the filament in the superconducting wire of the superconducting coil, and due to this condition, the flux jumping was more likely to occur in the superconducting joint than in the superconducting coil.

In addition, it was also supposed that since contacts among end portions of respective filaments of the superconducting wires were not uniform in the superconducting joint, the current density also became inhomogenous, thereby resulting in high current density locally.

The foregoing problems are essential problems to be solved, and it is very useful to provide a circuit (superconducting circuit) consisting of a plurality of superconducting wires such as a superconducting magnet provided with a superconducting joint which is capable of suppressing a generation of the flux jumping as well as the quenching, without using lead.

It is, therefore, an object of the present invention to provide a superconducting circuit which is capable of suppressing an occurrence of flux jumping as well as quenching without using lead, a production method of a superconducting joint of the superconducting circuit, a superconducting magnet which uses the superconducting joint, and a production method of the superconducting magnet.

According to a first aspect of the present invention, there is provided a superconducting circuit comprising a superconducting joint that joints a niobium titanium superconducting wire having a structure where a filament made of niobium titanium alloy is arranged in a matrix made of copper or copper alloy and other superconducting wire, in which a volume ratio or a surface density of an α-Ti precipitation in the niobium titanium alloy of the filament in the superconducting joint is smaller than the volume ratio or the surface density of the α-Ti precipitation in the niobium titanium alloy of the filament in the niobium titanium superconducting wire in a portion other than the superconducting joint. In addition, when the niobium titanium superconducting wire in the superconducting joint and the niobium titanium superconducting wire in a portion other than the superconducting joint are placed in the same magnetic field intensity, a critical current density of the filament in the superconducting joint is lower than the critical current density of the filament in the niobium titanium superconducting wire in the portion other than the superconducting joint. Furthermore, a Vickers hardness of the filament in the superconducting joint is lower than a Vickers hardness of the filament in the niobium titanium superconducting wire in the portion other than the superconducting joint. The superconducting circuit is a superconducting magnet provided with a superconducting circuit which has the foregoing characteristics and the superconducting joint that joints the niobium titanium superconducting wire constituting a superconducting coil or a persistent current switch and other superconducting wire.

According to the present invention, a superconducting circuit which is capable of suppressing an occurrence of flux jumping as well as quenching without using lead, a production method of a superconducting joint of the superconducting circuit, a superconducting magnet which uses the superconducting joint, and a production method of the superconducting magnet can be provided.

DETAILED DESCRIPTION OF THE PREFERRED EMBODIMENT

Next, an embodiment of the present invention will be explained in detail by referring to drawings as appropriate.

Figure 1:
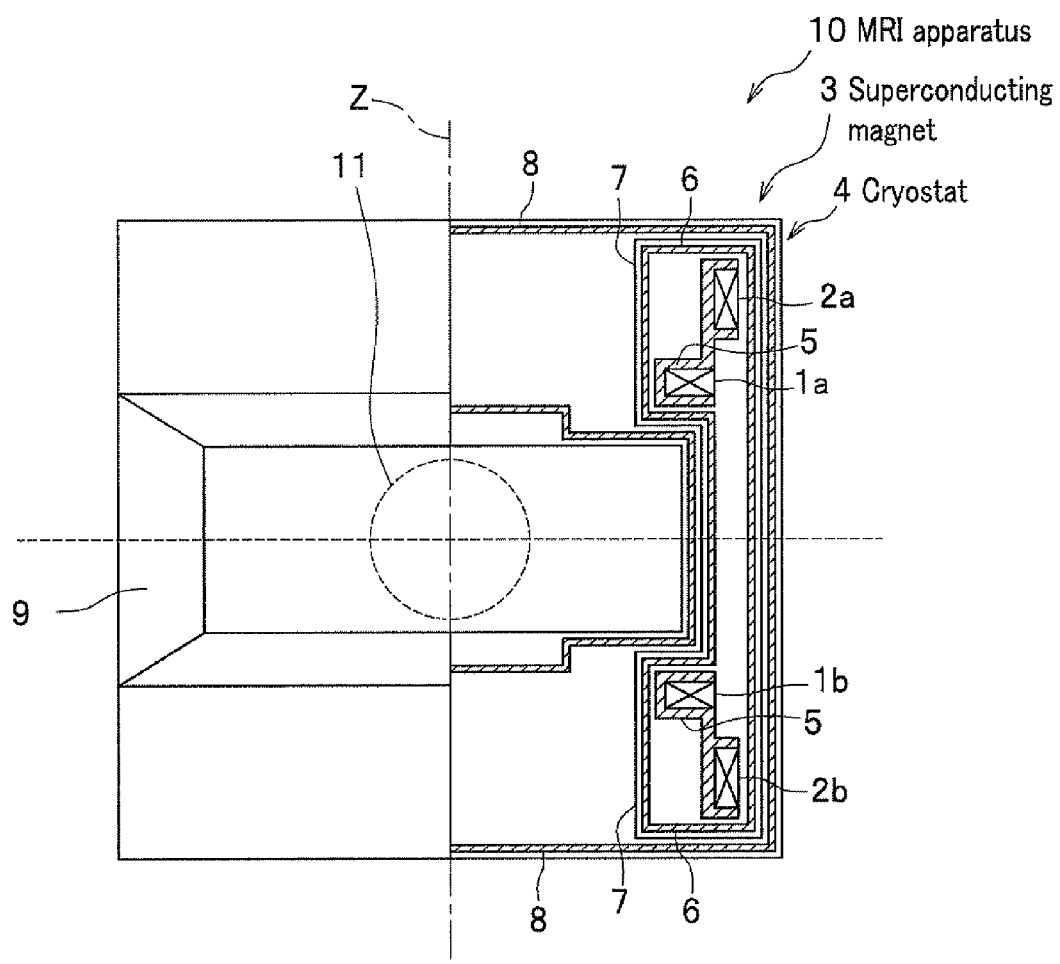
FIG. 1 is a side view (left side) and a cross sectional view (right side) of a magnetic resonance imaging (MRI) apparatus provided with a superconducting magnet (superconducting circuit) according an embodiment of the present invention.
Figure 10:
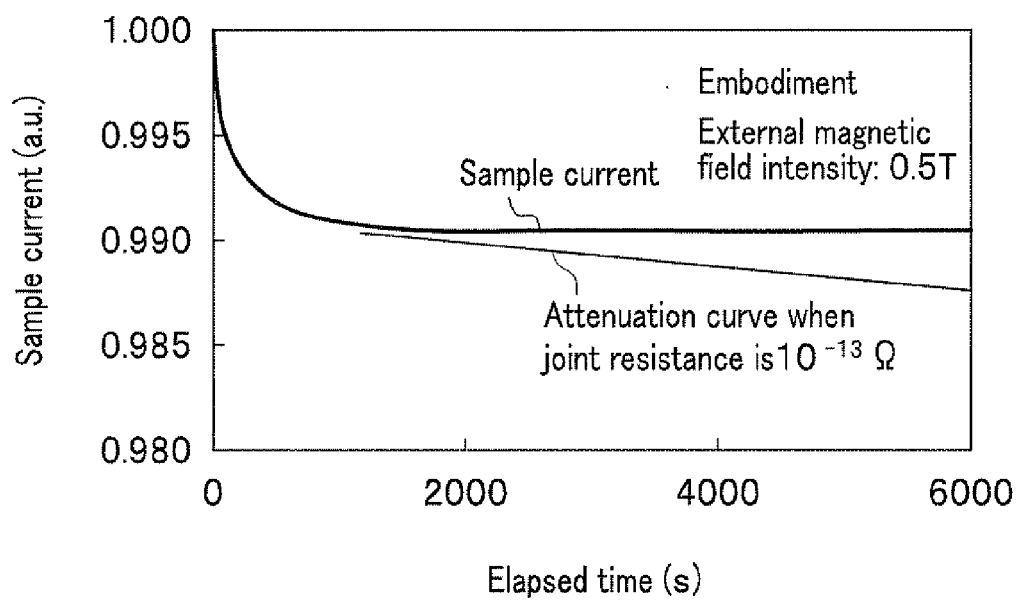
FIG. 10 is a graph showing a relationship between a sample current and an elapsed time of an evaluation sample of the embodiment.

An MRI apparatus 10 is shown in FIG. 1. A left half of FIG. 1 is a side view of a left half of the MRI apparatus 10, and a right half of FIG. 1 is a cross sectional view of a right half of the MRI apparatus 10. The MRI apparatus 10 shown in FIG. 10 is, so-called an open-type MRI apparatus, and has an active-shield type superconducting magnet 3. The superconducting magnet 3 is, so-called an open vertical field magnet. The superconducting magnet 3 is installed in the MRI apparatus 10 for generating a high intensity and low attenuation magnetic field, that is, a stable magnetic field with time, in an imaging area 11. In addition, according to the characteristics of the superconducting magnet 3, the superconducting magnet 3 may also be installed in an NMR apparatus and the MRI apparatus 10.

The superconducting magnet 3 includes a pair of main coils (superconducting coil) 1a, 1b and a pair of shied coils (superconducting coil) 2a, 2b. The pair of the main coils 1a, 1b are arranged so that each center axis Z of the main coils 1a, 1b matches to each other. The main coils 1a, 1b generate a homogeneous magnetic field in the imaging area 11. The pair of shield coils 2a, 2b are also arranged facing each other so that a center axis of each of the shield coils 2a, 2b and the center axis Z match to each other. The shield coil 2a is located adjacent to the main coil 1a and generates a magnetic field in a direction opposite to a direction of a magnetic field generated by the main coil 1a, for reducing a leakage of the magnetic field outside the superconducting magnet 3, namely, outside the MRI apparatus 10. Similarly, the shield coil 2b is located adjacent to the main coli 1b and generates a magnetic field in a direction opposite to a direction of a magnetic field generated by the main coil 1b, for reducing the leakage of the magnetic field outside the superconducting magnet 3, and in addition, outside the MRI apparatus 10. In an upper portion of the superconducting magnet 3, a bobbin 5 on which the main coil 1a and the shield coil 2a are wound and supported/fixed is disposed. Similarly, the bobbin 5 on which the main coil 1b and the shield coil 2b are wound and supported/fixed is disposed in a lower portion of the superconducting magnet 3.

The superconducting magnet 3 has a cryostat 4. The cryostat 4 includes a cooling medium container 6 containing the main coils 1a, 1b, the shield coils 2a, 2b and the bobbin 5 together with a cooling medium, a heat radiation shield 7 containing the cooling medium container 6 and shielding a heat radiation inward the radiation shield 7, and a vacuum vessel 8 being maintained in vacuum and containing the cooling medium container 6 and the radiation shield 7. As a cooling medium, liquid helium (He), or liquid nitrogen ($N_2$) in some case may be used. The cooling medium container 6, the radiation shield 7 and the vacuum vessel 8 are disposed both in an upper portion and in a lower portion, respectively, so as to avoid the imaging area 11, and the upper portion and the lower portion are connected by a connection pillar 9 to support with each other.

A test subject lies in the MRI apparatus 10 so that an examination part of the test subject is within the imaging area 11. Then, the MRI apparatus 10 measures a nuclear magnetic resonance signal emitted from a nuclear spin of a hydrogen atom due to the NMR phenomenon and executes arithmetic processing of the nuclear magnetic resonance signal. As a result, a tomographic image which shows a density of the hydrogen atom nucleus of the test subject body can be obtained.

Figure 2:
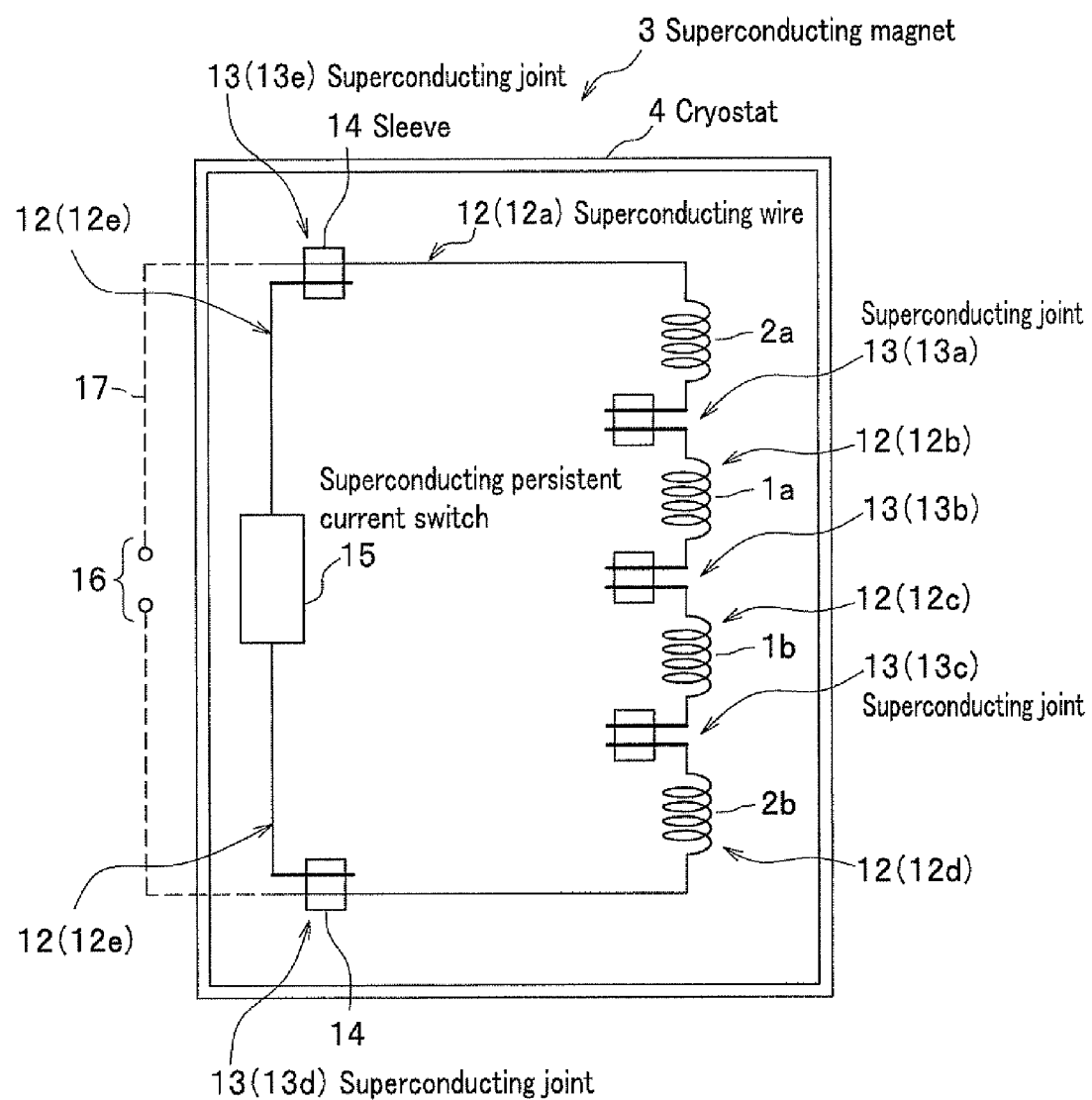
FIG. 2 is a circuit diagram of a superconducting magnet (superconducting circuit) according to the embodiment of the present invention.

FIG. 2 is a circuit diagram of the superconducting magnet (superconducting circuit) 3 according to the embodiment. The superconducting magnet 3 is a superconducting circuit housed in the cryostat 4, and forms a closed circuit, where the main coil (superconducting coil) 1a and the main coil 1b (superconducting coil) having the same magnetizing direction, the shield coil (superconducting coil) 2a having a magnetizing direction opposite to the magnetizing direction of the main coil 1a and the shield coil (superconducting coil) 2b having a magnetizing direction opposite to the magnetizing direction of the main coil 1b, and a superconducting persistent current switch 15 are connected in series. Namely, the superconducting circuit 3 forms a closed circuit structure where both end portions connecting a plurality of superconducting coils 1a, 1b, 2a and 2b are shunted at the superconducting persistent current switch 15. Meanwhile, all wirings of the closed circuit are made by a superconducting wire 12. In addition, a magnetizing power terminal 16 made of a normal conducting wire 17 is connected in parallel with the superconducting persistent current switch 15.

For example, the superconducting coil 1a is a tightly wound superconducting wire which has a loss close to zero when applied current in a cryogenic temperature environment such as in liquid helium, and can generate a high intensity magnetic field by applying current. The superconducting persistent current switch 15 is the one that has a heater close to the superconducting wire 12 (12e), and can switch between the superconducting state and the normal conducting state by heating/cooling the superconducting wire 12e by the heater.

An operation procedure of the superconducting magnet 3 is as follows. First, the superconducting persistent current switch 15 is heated to transition to the normal state, and a predetermined current is applied to the superconducting coil 1a and the like from an external power source through the magnetizing power terminal 16 to magnetize the superconducting magnet 3. Next, the superconducting persistent current switch 15 is cooled to transition to the superconducting state, and a current from the external power source is decreased to zero. Then, the superconducting magnet 3 (superconducting circuit) goes into a persistent current mode, and a persistent current flows in the superconducting coil 1a and the like to generate a high intensity magnetic field without supplying an electric power from outside.

Looking at the superconducting magnet 3 (superconducting circuit) in detail, the shield coil (superconducting coil) 2a is formed by winding a middle portion of a superconducting wire 12a on a bobbin 8 (not shown). Similarly, the main coil (superconducting coil) 1a is formed by winding a middle portion of a superconducting wire 12b on a bobbin 5 (not shown), the main coil (superconducting coil) 1b is formed by winding a middle portion of a superconducting wire 12c on the bobbin 5 (not shown), and the shield coil (superconducting coil) 2b is formed by winding a middle portion of a superconducting wire 12d on the bobbin 8 (not shown). In addition, the heater is disposed in the vicinity of a middle portion of the superconducting wire 12e to form the superconducting persistent current switch 15.

One end portion of the superconducting wire 12a and one end portion of the superconducting wire 12b are jointed in a superconducting joint 13a. Similarly, the other end portion of the superconducting wire 12b and one end portion of the superconducting wire 12c are jointed in a superconducting joint 13b, the other end portion of the superconducting wire 12c and one end portion of the superconducting wire 12d are jointed in a superconducting joint 13c, the other end portion of the superconducting wire 12d and one end portion of the superconducting wire 12e are jointed in a superconducting joint 13d, and the other end portion of the superconducting wire 12e and the other end portion of the superconducting wire 12a are jointed in a superconducting joint 13e. Meanwhile, in the jointing of a superconducting wire, generally, both end portions of the superconducting wires 12 are jointed to each other. However, it is possible to produce such a superconducting circuit that at least one superconducting wire among superconducting wires to be jointed is jointed to the other superconducting wires in the middle of the at least one superconducting wire.

Figure 3A:
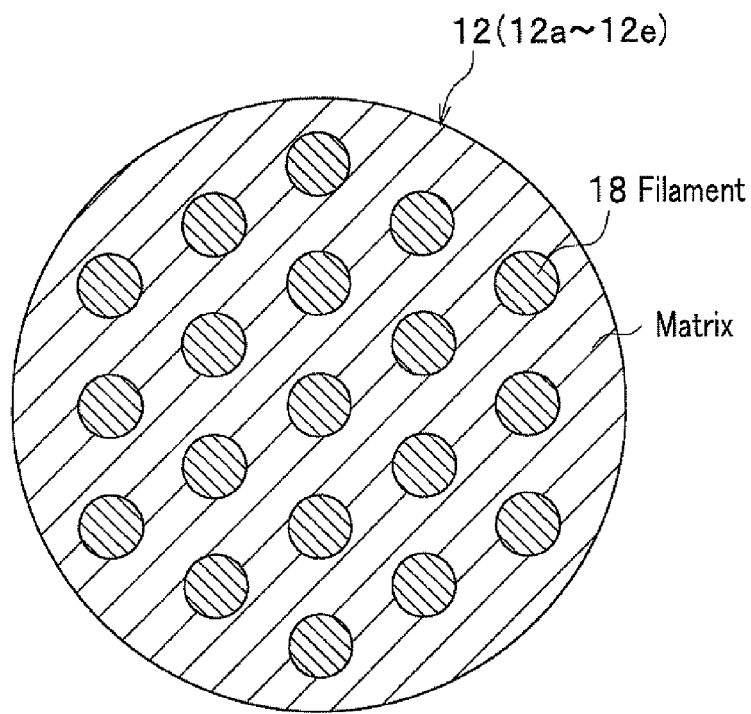
FIG. 3A is a cross sectional view of a superconducting wire.

FIG. 3A is a cross sectional view of the superconducting wire 12 (12a to 12e). The superconducting wire 12 has a structure where a plurality of filaments 18 made of niobium titanium (NbTi) alloy are dispersedly arranged within a matrix 19 made of copper (Cu) or copper alloy. The filament 18 having a diameter between 1 and 200 μm may be generally used. A number of filaments 18 dispersed in the matrix 19 is generally between 10 and 10000, although FIG. 3A shows the case of 19. It is noted that the present invention may be applied to the superconducting wire 12 where the diameter of the filament 18 and the number of the filaments 18 are not included in the foregoing general ranges.

Figure 3B:
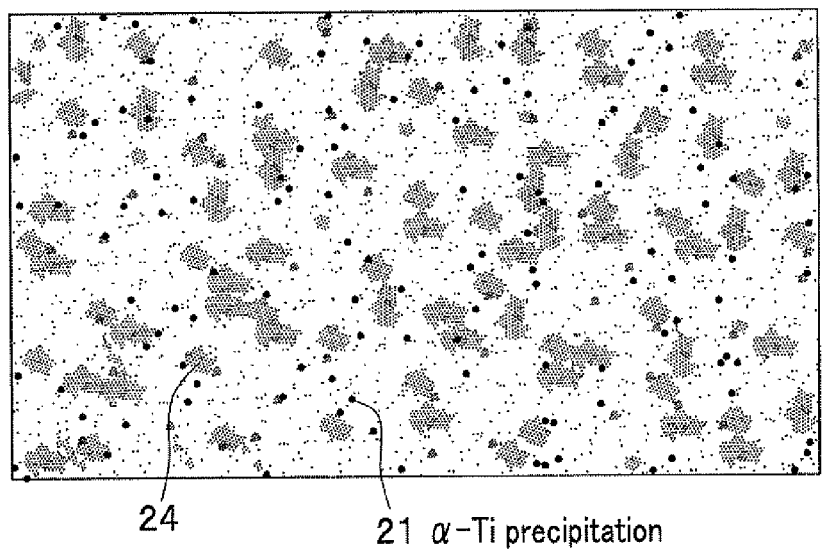
FIG. 3B is a partial enlarged view of a filament cross section of a superconducting wire.

FIG. 3B is a partial enlarged view of a cross section of the filament 18 in the superconducting wire 12. It can be observed that fine α-Ti precipitations 21 are dispersedly and homogeneously precipitated. In addition, niobium titanium (NbTi) crystals 24 which are finely broken up can also be observed.

Figure 4:
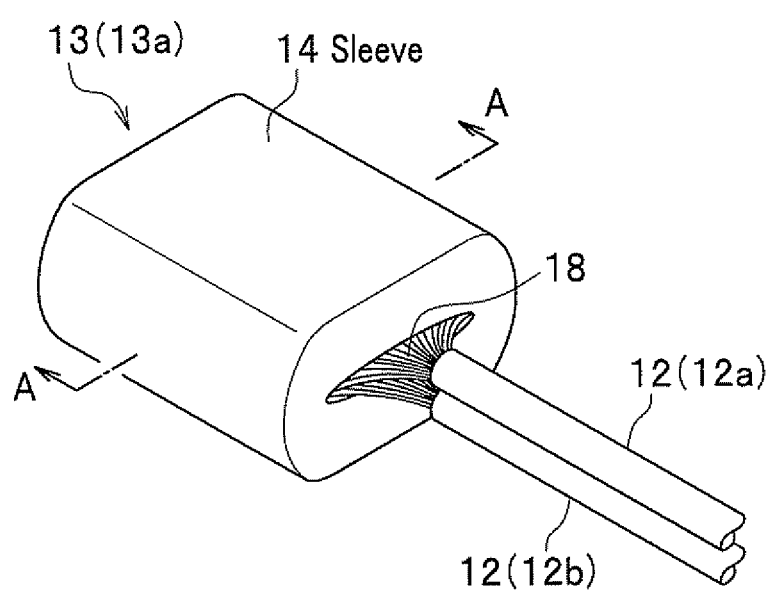
FIG. 4 is a perspective view of a superconducting joint.

FIG. 4 is a perspective view of the superconducting joint 13 (13a). The superconducting joint 13a is shown in FIG. 4. However, the other superconducting joints 13 (13b to 13e) have the same structure with the superconducting joint 13a. FIG. 4 shows that an end portion of the superconducting wire 12 (12a) and an end portion of the superconducting wire 12 (12b) are jointed in the superconducting joint 13 (13a). In the superconducting joint 13, matrixes in the end portions of two superconducting wires 12 (12a and 12b) are removed, and filaments 18 of the superconducting wires 12 (12a and 12b) are exposed. Both the filaments 18 of the superconducting wire 12a and the superconducting wire 12b are inserted together into a uniting member (cylindrical metal member: sleeve 14) and tightly pressure-welded with each other. It is noted that a number of superconducting wires 12 to be jointed is not limited to two, but may be three or more than three. In addition, a plurality of the superconducting wires 12 to be jointed are not always niobium titanium superconducting wires, and if at least one superconducting wire 12 is the niobium titanium superconducting wire, effects of the present invention can be obtained. For example, the other superconducting wires 12 may be made of superconducting materials such as niobium three tin, magnesium diboride, and copper oxides. In addition, it is preferable that a material of the uniting member (sleeve 14) has a low resistivity and a high thermal conductivity as with the material of the matrix 19, and a metal (alloy) containing at least one of Cu, Al, Ag, Au and Ni as a main composition may be used for the material of the uniting member. In addition, the uniting member is not necessarily in a sleeve shape (cylinder), as long as the uniting member has a structure capable of maintaining a status that the filaments 18 are tightly pressure-welded with each other.

Figure 5A:
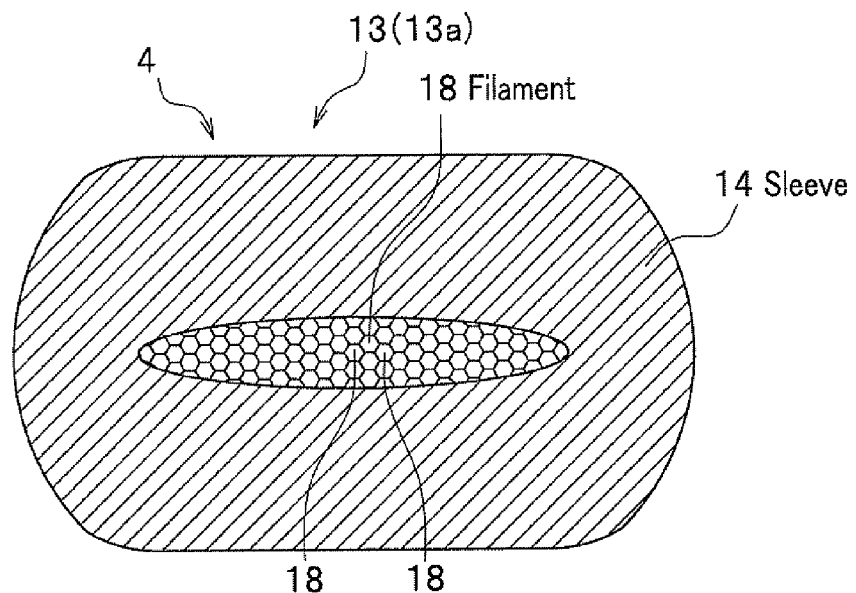
FIG. 5A is a cross sectional view taken along A-A line of FIG. 4.

FIG. 5A is a cross sectional view of the superconducting joint 13 (13a) taken along A-A line in FIG. 4. Within the sleeve 14, neighboring filaments 18 are tightly adhered with each other without spaces. Therefore, the filaments 18 come in contact uniformly with each other and a current distributes homogeneously, thereby resulting in suppressing a local deviation of the current density.

Figure 5B:
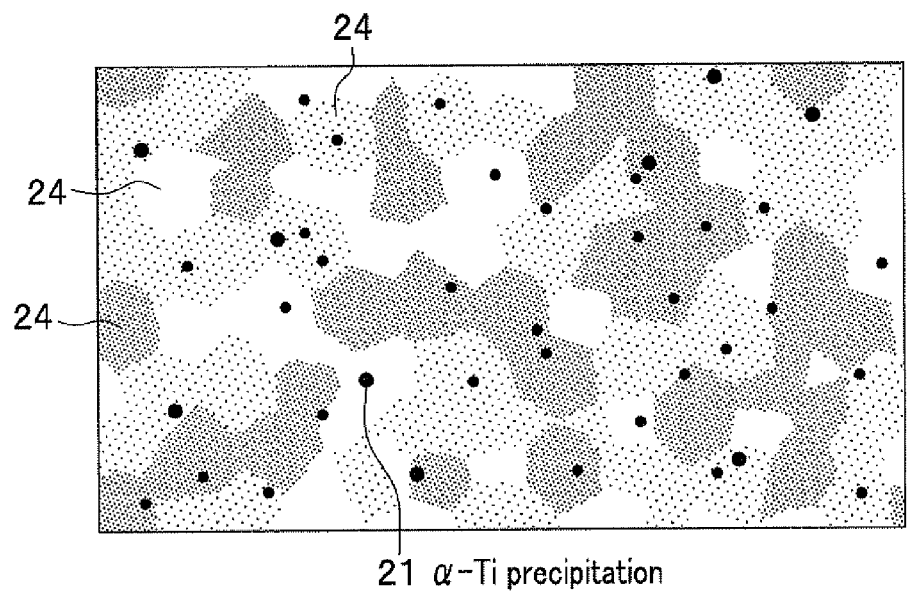
FIG. 5B is a partial enlarged view of a filament cross section of a superconducting joint.

FIG. 5B is a partial enlarged view of a cross section of one filament 18 among a plurality of filaments 18 of the superconducting joint 13 (13a) in FIG. 5A. When the filament 18 of the superconducting joint 13 in FIG. 5B is compared with the filament 18 of the superconducting wire 12 in a portion other than the superconducting joint 13 in FIG. 3B, a volume ratio or a surface density of the α-Ti precipitation 21 in niobium titanium alloy of the filament 18 of the superconducting joint 13 is smaller than that in the portion other than the superconducting joint 13, and a size of the α-Ti precipitation 21 in the superconducting joint 13 is larger than that in the portion other than the superconducting joint 13. Meanwhile, the volume ratio of the α-Ti precipitation 21 was calculated as follows. After the superconducting wire 12 or the superconducting joint 13 is cut, the cut surface is subjected to an appropriate treatment. When the cut surface of the filament 18 is observed by a scanning electron microscope, the α-Ti precipitation 21 can be observed with different contrast from niobium titanium alloy portion. Then, an area ratio of the α-Ti precipitation 21 in the electron microscope image within 5 μm square is calculated, and three-halves (3/2) power of the area ratio was assumed as the volume ratio. In addition, a surface density of the α-Ti precipitation 21 was assumed as a sum of contour lengths of interfaces of the α-Ti precipitations 21 within a unit area in the cut surface. A size of a niobium titanium (NbTi) crystal 24 in the superconducting joint 13 is larger than that in the portion other than the superconducting joint 13. In addition, a Vickers hardness of the filament 18 in the superconducting joint 13 is lower than that of the filament 18 in the superconducting wire 12 in the portion other than the superconducting joint 13. Due to the lowering of the Vickers hardness of the filament 18 in the superconducting joint 13, as shown in FIG. 5A, the neighboring filaments 18 can be distorted so as to tightly adhere with each other without forming spaces in a press process described later.

These differences described above come from the difference that the filament 18 in the superconducting joint 13 was heat-treated, while the filament 18 in the portion other than the superconducting joint 13 was not heat-treated. The heat treatment will be described later in detail. The heat treatment here is a heat treatment to suppress a precipitation of the α-Ti precipitation 21, and different from a heat treatment to promote the precipitation of the α-Ti precipitation 21 which was conventionally conducted for improving the critical current density. In the conventional heat treatment, the α-Ti precipitation 21, which is a fine precipitation having a role of a fine pinning center, was introduced in the filament 18 by giving a heavy processing and an aging heat treatment for improving the critical current density of the superconducting wire 12 in a magnetic field.

Figure 6:
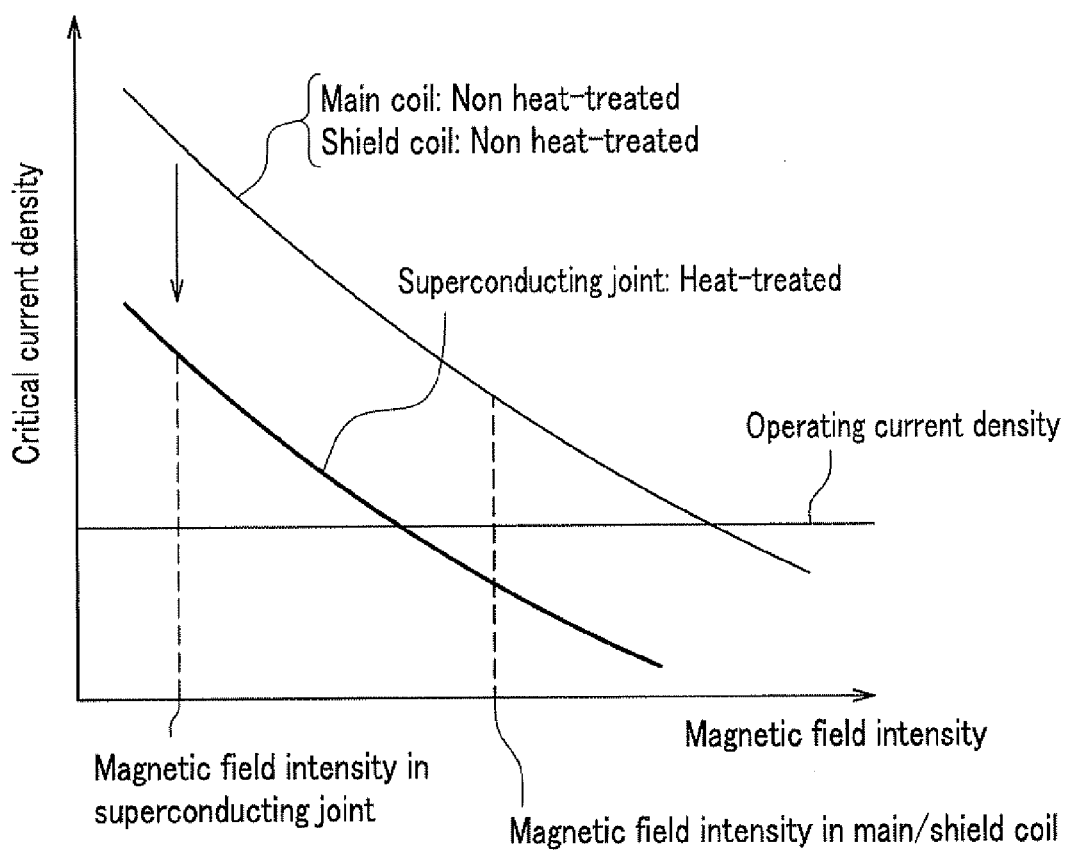
FIG. 6 is a graph showing a relationship between a critical current density and a magnetic field intensity of a filament in each of a main (shield) coil and a superconducting joint.

FIG. 6 are relationships between a critical current density and a magnetic field intensity, for the filament 18 (heat-treated) in the superconducting joint 13 and the filament 18 (non heat-treated) in the portion other than the superconducting joint 13, such as the main coil 1a. Both the critical current densities of the heat-treated filament 18 in the superconducting joint 13 and the non heat-treated filament 18 in the main coil 1a and the like, increase as the magnetic field intensity decreases. In addition, the critical current density of the heat-treated superconducting joint 13 is larger than that of the non heat-treated main coil 1a and the like at any magnetic field intensity. Namely, when the heat-treated superconducting joint 13 and the non heat-treated main coil 1a and the like are placed in the same magnetic field intensity, the critical current density of the filament 18 of the heat-treated superconducting joint 13 is lower than that of the non heat-treated main coil 1*a* and the like.

With respect to the main coil 1*a* and the like, for example, a value of a persistent current flowing in the main coil 1*a* and the like is set so that a desired magnetic field intensity can be generated in the imaging area 11 (see FIG. 1) of the MRI apparatus 10, and an operating current density of the persistent current flowing in the superconducting wire 12 constituting the main coil 1*a* and the like is set. The operating current density is set within a range smaller than the critical current density of the main coil 1*a* and the like (non heat-treated) generating the desired magnetic field intensity.

The superconducting magnet 3 is a closed circuit of the superconducting wire 12. Therefore, in the operation of the superconducting magnet 3, an operating current in the superconducting joint 13 is identical to the operating current in the main coil 1*a* and the like.

In addition, the main coil 1*a* and the like are disposed in the middle of the superconducting wire 12, and the superconducting joint 13 is disposed at an end of the superconducting wire 12 distant from the main coil 1*a* and the like. Therefore, a magnetic field intensity at a position where the superconducting joint 13 is disposed is weaker than the magnetic field intensity at a position where the superconducting wire 12 constituting the main coil 1*a* and the like exists.

Conventionally, a critical current density of the superconducting joint 13, which is placed in a weak magnetic field, for example, in the MRI apparatus 10, is located on the extension of the diagonally left up graph of critical current density of the main coil 1*a* and the like (non heat-treated), and has a large value. Namely, a critical current density $J_c$ of the filament 18 depends on a magnetic field intensity where the filament 18 is placed, and has a tendency to become large as the magnetic field intensity becomes small. Therefore, a critical current density $J_c$ in the superconducting joint 13, where the magnetic field intensity is small, becomes larger than that in the main coil 1*a* and the like where the magnetic field intensity is large, thereby the critical current density $J_c$ of the filament 18 in the superconducting joint 13 was larger than that of the filament 18 in the superconducting wire 12 of the main coil 1*a* and the like. As a result, the flux jumping was likely to occur in the superconducting joint 13 rather than in the main coil 1*a* and the like.

In contrast to the conventional superconducting joint, according to the embodiment of the present invention, a critical current density lowered by the heat treatment of the filament 18 is applied to the critical current density in the superconducting joint 13. In the embodiment, since the critical current density in the superconducting joint 13 was lowered, an occurrence of the flux jumping can be suppressed, and in addition, an occurrence of the quenching can also be suppressed. These effects and advantages are the same with respect to the filament 18 in the shield coil 2*a* and the like.

Next, a production method of superconducting joints 13 (13*a* to 13*e*) according to the embodiment will be explained. The production method is a method for producing a superconducting joint that joints a niobium titanium superconducting wire having a structure where filaments made of niobium titanium (NbTi) alloy are arranged in a matrix made of copper (Cu) or copper alloy with other superconducting wire. In the following example, a temperature of the filaments of the superconducting wire is raised to 400 to 600° C., and the matrix is removed to expose the filaments, then, the filaments of the respective superconducting wires are tightly adhered with each other using a uniting member.

Figure 7A:
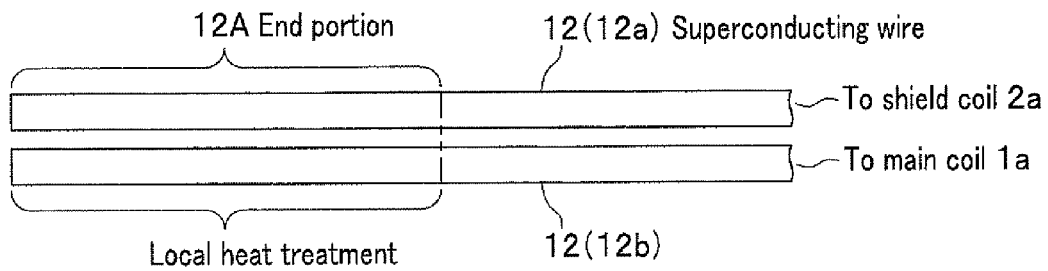
FIG. 7A is a view (view 1) for explaining a production method of a superconducting joint according to the embodiment of the present invention, and the view is a side view of an end portion of a superconducting wire which was locally heat-treated.

First, as shown in FIG. 7A, end portion 12A of each of the superconducting wires 12 (12*a* and 12*b*) is locally heat-treated (heat treatment). Superconducting wires 12*c* to 12*e* are also subjected to the same heat treatment. A length of the end portion 12A may be, for example, around 30 mm. Meanwhile, the end portion 12A may be heat-treated (heat treatment) at a temperature range between 400 and 600° C. for about one hour.

Figure 7B:
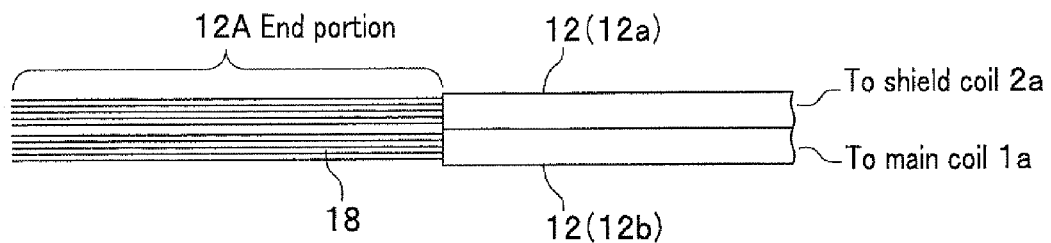
FIG. 7B is a view (view 2) for explaining a production method of a superconducting joint according to the embodiment of the present invention, and the view is a side view of an end portion of a superconducting wire whose filaments are exposed.

Next, as shown in FIG. 7B, a matrix 19 of each of the end portions 12A of the superconducting wires 12 (12*a* and 12*b*) is selectively dissolved and removed to expose the filament 18 in the end portion 12A. Meanwhile, when the filament 18 is made of niobium titanium alloy and the matrix 19 is made of copper, nitric acid ($HNO_3$) may be used for selectively dissolve the matrix 19 by dipping the end portion 12A into the nitric acid. The purpose of this process is to remove the matrix 19 for directly jointing each of the niobium titanium filaments 18, which is a superconductor, without an interface of the matrix 19 between the filaments 18. A mechanical method such as polishing/grinding other than the chemical method using, for example, nitric acid, may be used for removing the matrix 19.

Figure 7C:
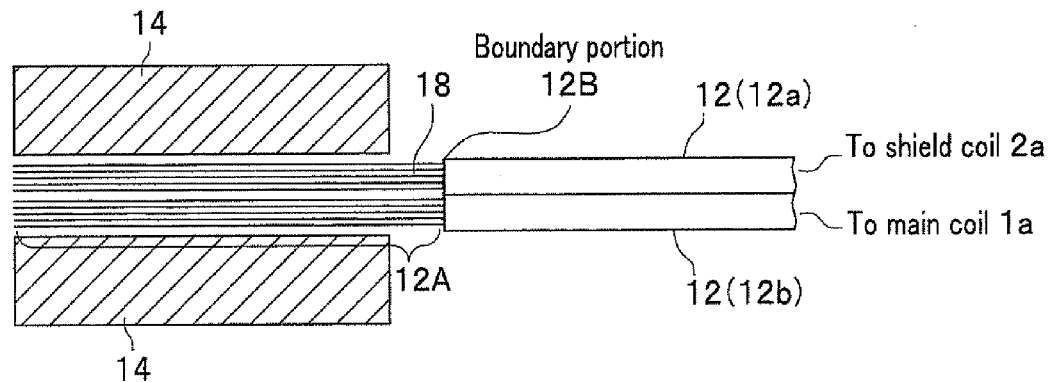
FIG. 7C is a view (view 3) for explaining a production method of a superconducting joint according to the embodiment of the present invention, and the view is a cross sectional view of a sleeve into which exposed filaments are inserted.
Figure 7D:
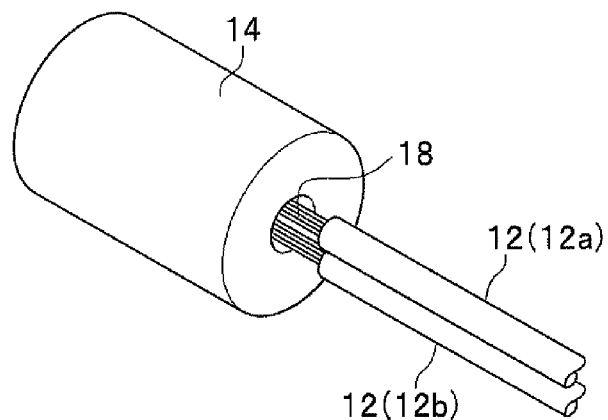
FIG. 7D is a view (view 4) for explaining a production method of a superconducting joint according to the embodiment of the present invention, and the view is a perspective view of a sleeve into which exposed filaments are inserted.

Next, as shown in FIG. 7C and FIG. 7D, the exposed filaments 18 of the end portion 12A of each of the superconducting wires 12 (12*a* and 12*b*) are inserted into a sleeve 14 made of metal. Meanwhile, as the sleeve 14, a sleeve made of copper and having a cylindrical shape with, for example, an inner diameter of 4 mm, an outer diameter of 15 mm, and a length of 25 mm may be used. It is preferable that the inner diameter of the sleeve 14 is between 2 and 10 times of a total cross section of a plurality of the filaments 18 inserted into the sleeve 14. When the inner diameter of the sleeve 14 is less than 2 times of the total cross section, insertion of the filaments 18 into the sleeve 14 becomes difficult. When the inner diameter of the sleeve 14 is more than 10 times, the filaments 18 do not form a closely packed structure after the press process. In addition, the outer diameter of the sleeve 14 was set to 15 mm. However, it is preferable that the outer diameter has a size which can appropriately and sufficiently secure a volume of the sleeve 14 in consideration of a volume (total cross section) of the filaments 18 inserted into the sleeve 14. Specifically, regarding the outer diameter of the sleeve 14, it is preferable that a cross section of the sleeve 14 is more than 10 times of the total cross section of all filaments 18 to be inserted. The length of the sleeve 14 was set to 25 mm. However, it is preferable that the length is adjusted depending on a value of the current flowing in the superconducting joint 13.

Meanwhile, a boundary portion 12B which is a boundary with the end portion 12A is preferably arranged distant from the sleeve 14, especially, from an end face of the sleeve 14 when the filament 18 is inserted into the sleeve 14. This is for relaxing a degree of bending of the filament 18 at the boundary portion 12B to avoid the breaking of the filament 18 in a press process, which will be described later.

Last, as shown in FIG. 4, the sleeve 14 into which the filaments 18 of the end portion 12A of each of the superconducting wires 12 (12*a*, 12*b*) are inserted is pressed and crashed for tightly pressure-welding the filaments 18 with each other. A uniaxial press machine may be used for pressing the sleeve 14. Meanwhile, the purpose of this process is to have the niobium titanium filaments 18 adhered tightly with each other through pressure welding, and accordingly, any process may be used as long as the niobium titanium filaments 18 can be pressed together with a strong force and the pressed status can be maintained. Therefore, for example, a structure that sandwiches the niobium titanium filaments 18 between divided metal members and fixes the filaments 18 by screws may be considered. In addition, for example, a method that the sleeve 14 is twisted or applied an isotropic force after the filaments 18 are inserted into the sleeve 14 may be used.

In addition, in the embodiment, a superconducting joint is formed by pressing a single position. However, the sleeve 14 may be divided into a plurality of short pieces and each of the short pieces may be pressed. Then, a press pressure for each short piece can be increased with the same press load, and thereby, a degree of adhesion of the filaments 18 can be improved. This method is effective when a size of the press machine is limited due to a limitation of, for example, working space.

This jointing method of a superconducting wire can be used as a production method of a superconducting magnet which includes a process to joint a superconducting wire made of niobium titanium and a superconducting wire made of a material other than the niobium titanium, and can be applied to the production of a superconducting coil and a persistent current switch. Here, as a production method of the superconducting joints 13 (13a to 13e) according to the embodiment, an example that conducts the heat treatment process before the matrix 19 is removed was explained. However, not limited to this, the same effect can be obtained when the heat treatment process is conducted after the matrix 19 is removed. In this case, it is required to strictly manage an oxygen concentration in the atmosphere during the heat treatment for preventing the filaments 18 from being oxidized. In addition, when the press process is conducted concurrently with the heat treatment, the press may be conducted under the condition that the filaments 18 are not sufficiently softened. Therefore, it is preferable to conduct the heat treatment before the press process because reduction of the spaces 25 is not easy. However, even if the heat treatment is conducted during or after the press process, the effect to reduce a critical current density to an appropriate range can be obtained. Then, the effect to suppress the flux jumping can be obtained.

Figure 8:
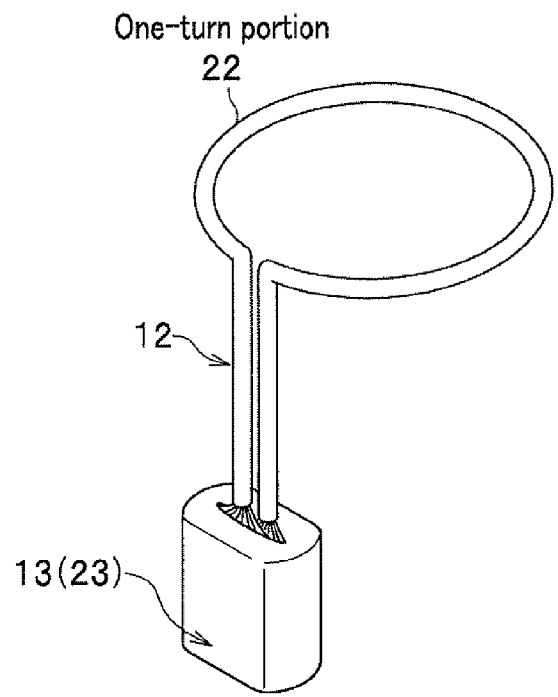
FIG. 8 is a perspective view of an evaluation sample of a superconducting joint produced by the embodiment and as a comparative example.

FIG. 8 is a perspective view of an evaluation sample of the superconducting joint 13 produced by the embodiment and as a comparative example. The evaluation sample has a closed circuit where both ends of a single superconducting wire are jointed within the superconducting joint 13. Meanwhile, a reference number 23 indicates a superconducting joint of the comparative example. A one-turn portion 22 that is a one-turn coil is formed in the center portion of the superconducting wire 12, and the one-turn portion 22 is distant from the superconducting joint 13. An evaluation sample whose end portion 12A (see FIG. 7A) of the superconducting wire 12 was locally heat-treated (heat treatment) and an evaluation sample whose end portion 12A of the superconducting wire 12 was not locally heat-treated were prepared by the embodiment and as the comparative example. In addition, the evaluation samples were prepared by varying a temperature of the local heating (heat treatment) on the end portion 12A of the superconducting wire 12. Specifically, nine evaluation samples whose respective end portions 12A of the superconducting wires 12 were heat-treated at 300° C., 350° C., 400° C., 450° C., 500° C., 550° C., 600° C., 650° C., and 700° C. were prepared. A heating time (heat treatment) was one hour. Meanwhile, a difference in appearance between an evaluation sample which was heated (heat treatment) according to the embodiment and an evaluation example as a comparative example which was not heated (no heat treatment) is almost nothing. Then, only the difference is that the superconducting joint 13 according to the embodiment is more crashed by the press due to softening of the filaments 18 than the superconducting joint 23 as the comparative example, and thereby becomes slightly thinner than the superconducting joint 23 as the comparative example. Meanwhile, a force to be applied to the evaluation sample in the press process was the same for all evaluation samples.

With respect to the evaluation samples, cut surfaces of the superconducting joints 13, 23 were observed, and Vickers hardness and electric characteristics of the filament in the cut surfaces were measured.

Figure 9:
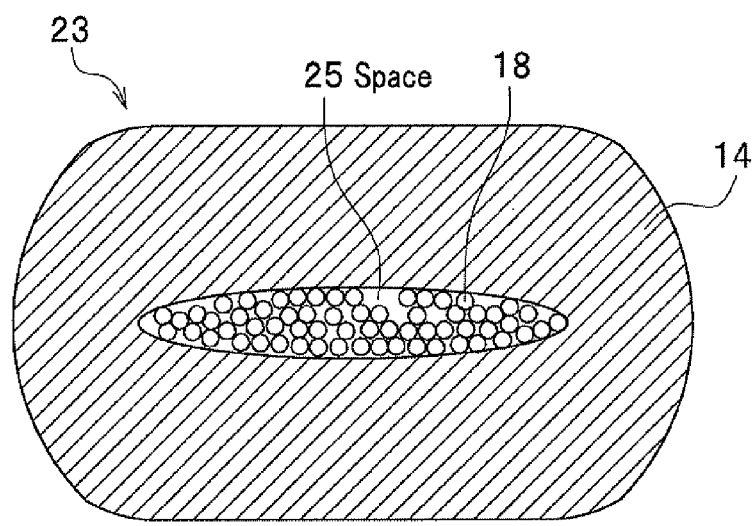
FIG. 9 is across sectional view of a superconducting joint of a comparative example.

FIG. 9 is a cross sectional view of the superconducting joint 23 of the comparative example (not heat-treated). Across sectional view of the superconducting joint 13 according to the embodiment (heat-treated at 550° C.) was the same with the cross sectional view in FIG. 5A. In the superconducting joint 23 of the comparative example (non heat-treated), the spaces 25 were observed between the neighboring filaments 18, and a circular cross sectional shape of the filament 18 was maintained. On the other hand, in the superconducting joint 13 according to the embodiment (heat-treated at 550° C.), the filaments 18 are tightly adhered with each other without forming the spaces 25. Therefore, the filaments 18 come in contact uniformly with each other, thereby the current distribution becomes homogeneous, and as a result, the current density can be prevented from local rising. In addition, since the filaments 18 are also tightly adhered with the sleeve 14 without forming the spaces 25, even if a heat is generated in the filaments 18, the heat is removed from the filaments 18 through rapid conduction in the sleeve 14. Then, the filaments 18 can be maintained at a cryogenic temperature. On the other hand, as shown in FIG. 9, if the spaces 25 exist between the filaments 18 and the sleeve 14, a cooling medium such as liquid helium (He) is filled in the spaces 25. Therefore, it appears that a heat generated by the filaments 18 can be rapidly cooled by the liquid helium. However, a thermal conductivity of the cooling medium is smaller than that of the sleeve 14 made of metal. Then, a temperature of the filaments 18 is likely to become unstable.

In addition, a partial enlarged view of a cross section of a single filament 18 in the superconducting joint 13 according to the embodiment (heat-treated at 550° C.) was the same with the cross sectional view in FIG. 5B, and a partial enlarged view of a cross section of a single filament 18 in the superconducting joint 23 of the comparative example (non heat-treated) was the same with the cross sectional view in FIG. 3B. As seen from these views, in the single filament 18 of the superconducting joint 13 according to the embodiment (heat-treated at 550° C.), a volume ratio and a surface density of the α-Ti precipitation 21 in the niobium titanium alloy of the filament 18 are smaller than those in the single filament 18 of the superconducting joint 23 of the comparative example (non heat-treated). In addition, a grain size of the niobium titanium crystal 24 of the embodiment is larger than that of the comparative example. Further, a Vickers hardness of the filament 18 in the superconducting joint 13 according to the embodiment is lower, that is softer, than that in the superconducting joint 23 of the comparative example. In the embodiment, since the Vickers hardness of the filament 18 in the superconducting joint 13 is low, the filament 18 is easily plastically deformed, and thereby the neighboring filaments 18 can be deformed to be tightly adhered with each other without forming spaces 25, as shown in FIG. 5A.

Figure 11:
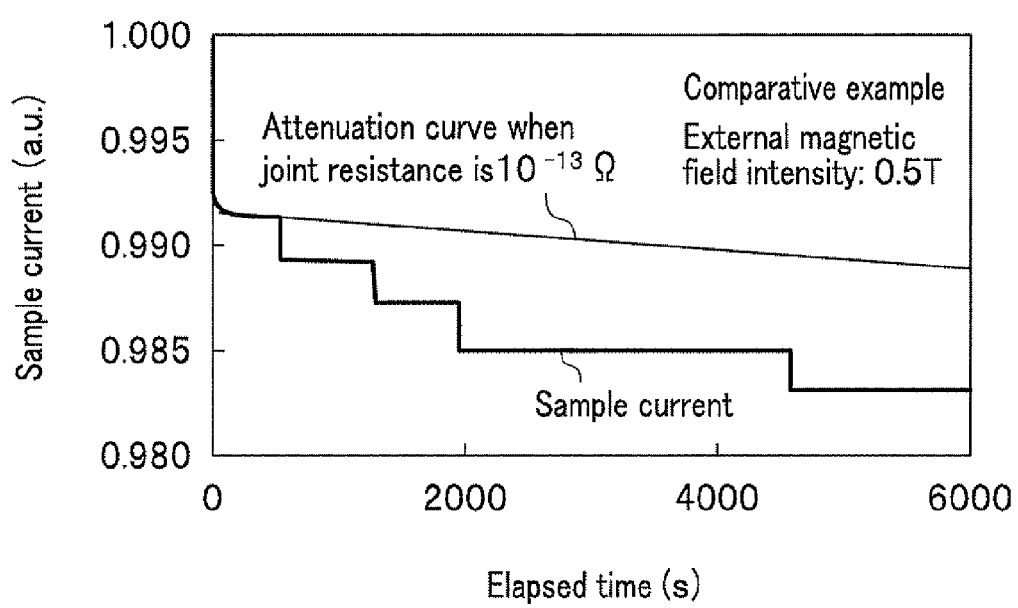
FIG. 11 is a graph showing a relationship between a sample current and an elapsed time of an evaluation sample of a comparative example.

Next, electric characteristics of the evaluation samples of the embodiment and the comparative example will be explained. FIG. 10 shows a relationship between an elapsed time and a sample current of an evaluation sample according to the embodiment, and FIG. 11 shows a relationship between an elapsed time and a sample current of an evaluation sample of the comparative example.

The electrical characteristics were measured as follows. A predetermined magnetic field having a magnetic field intensity, for example, 0.5 T which is substantially identical to a magnetic field intensity in the superconducting joint 13 of the MRI apparatus 10 was generated in the superconducting joints 13, 23 as an external magnetic field by an external apparatus. Next, the one-turn portion 22 (see FIG. 8) traps a flux of the predetermined magnetic field, and a magnetic field intensity generated in the center of the one-turn portion 22 is measured to calculate a sample current flowing in the superconducting wire 12, then, the sample current at each elapsed time from the trapping of the flux is normalized by the current value just after the trapping of the flux. Meanwhile, assuming that the sample current follows formula 2, sample currents (target current) in the case that a joint resistance that is a target resistance of the superconducting joints 13, 23 is $10^{-13}\Omega$ are calculated and displayed in FIG. 10 and FIG. 11 for easy comparison with the target current of the sample current.

$$I(t) = I_0 \exp\left(-\frac{R}{L}t\right) \quad \text{formula 2}$$

where,

I(t): sample current (A)

$I_0$: sample current just after induction (A)

t: elapsed time after induction (s)

R: joint resistance ($\Omega$)

L: inductance (H) of evaluation sample

In the embodiment, attenuation of the sample current is extremely small, and the sample current exceeded a sample current (target current) in the case that the joint resistance is $10^{-13}\Omega$.

On the other hand, in the comparative example, the sample current decreased discontinuously after a certain time elapsed. This discontinuous decrease of the sample current was supposed to be caused by the flux jumping generated in the superconducting joint 23.

Next, evaluation results of the nine evaluation samples which were heat-treated at 300° C., 350° C., 400° C., 450° C., 500° C., 550° C., 600° C., 650° C., and 700° C., respectively, will be described.

First, a part of a cross section of a single filament 18 in the superconducting joint 13 was observed by a scanning electron microscope. In the observation, a dispersion status of the α-Ti precipitation 21 in the filament 18 was observed. As a result, it was found that the α-Ti precipitation 21 was decreased and enlarged with increase in temperature when a temperature of the heat treatment was raised more than 400° C.

Next, a critical current density of the filament 18 of the superconducting joint 13 was measured. As a result, it was found that the critical current density of the filament 18 was decreased with increase in temperature when a temperature of the heat treatment was raised more than 400° C., and at 400° C., the critical current density was decreased to about 80% of that of the filament 18 which was not heat-treated, and further, at 600° C., decreased to about 5% of that of the filament 18 which was not heat-treated.

Next, a Vickers hardness of the filament 18 of the superconducting joint 13 was measured. As a result, it was found that the Vickers hardness of the filament 18 was decreased with increase in temperature when a temperature of the heat treatment was raised more than 400° C., and at 400° C., the Vickers hardness was decreased to about 90% of that of the filament 18 which was not heat-treated, and further, at 600° C., decreased to about 30% of that of the filament 18 which was not heat-treated.

Next, a size of the space 25 (see FIG. 9) was evaluated by a ratio (occupation ratio) of a volume of the filament 18 occupying in an inner space of the sleeve 14 to a volume of the inner space of the sleeve 14. As a result, it was found that the occupation ratio was increased due to increase in distortion of the filament 18 with increase in temperature when a temperature of the heat treatment was raised more than 400° C., and at 400° C., the occupation ratio was increased about 70%, and further, at about 600° C., increased more than 90%. Meanwhile, the volume of the inner space can be calculated from inner area of the cross sectional shape of the sleeve 14.

With respect to a difference between the filament 18 (heat-treated) in the superconducting joint 13 and the filament 18 (non heat-treated) in the portion other than the superconducting joint 13 such as the main coil 1a and the like, the volume ratio (surface density) of the α-Ti precipitation 21 was referred. Since the α-Ti precipitation 21 works as a flux pinning center, the critical current density can be lowered by reducing the volume ratio (surface density). However, the critical current density is not primarily determined by the volume ratio (surface density) of the α-Ti precipitation 21, but also depends on a shape of the α-Ti precipitation 21 and a status of the niobium titanium crystal 24.

Therefore, when the filament 18 (heat-treated) in the superconducting joint 13 is compared with the filament 18 (non heat-treated) in the portion other than the superconducting joint 13 such as the main coil 1a and the like, for example, even if both the volume ratios (surface densities) of the α-Ti precipitation 21 are identical, if the shape of the α-Ti precipitation 21 and the status of the niobium titanium crystal 24 of the filament 18 (heat-treated) in the superconducting joint 13 are the shape and the status that lower a role of the pinning center in comparison with those of the filament 18 (non heat-treated) in the portion other than the superconducting joint 13 such as the main coil 1a and the like, the effect similar to the reduction of the volume ratio (surface density) of the α-Ti precipitation 21 can be obtained.

From the evaluation results described above, it was found that a critical current density and a Vickers hardness of the filament 18 were varied by introduction of a heat treatment process. However, when a temperature of the heat treatment is more than 600° C., there is a possibility that the critical current density is lowered to a value lower than a value of practical use, and thereby a current required to the superconducting joint 13 can not be supplied in some case. In addition, when the temperature of the heat treatment is less than 350° C., since the lowering of the critical current density and the Vickers hardness is small, the effect for suppressing the flux jumping is small, and a discontinuous reduction of the sample current was observed, as with the result of the comparative example.

Meanwhile, as described above, the important thing is to suppress the flux jumping by lowering a critical current density of the filament 18.

As a one process which can suppress the flux jumping, a heat treatment was adopted. However, another process which can input energy in the filament 18, for example, a laser irradiation and an application of ultrasonic vibration may be used as long as the another process can achieve the purpose.

What is claimed is:

1. A superconducting circuit comprising a superconducting joint that joints a niobium titanium superconducting wire having a structure where a filament made of niobium titanium alloy is arranged in a matrix made of copper or copper alloy and other superconducting wire, wherein, in operation, a magnetic field intensity where the superconducting joint is placed is smaller than the magnetic field intensity where a main coil of the niobium titanium superconducting wire in a portion other than the superconducting joint is placed, wherein a volume ratio or a surface density of an $\alpha$-Ti precipitation in the niobium titanium alloy of the filament in the superconducting joint is smaller than the volume ratio or the surface density of the $\alpha$-Ti precipitation in the niobium titanium alloy of the filament in the niobium titanium superconducting wire in the portion other than the superconducting joint, and wherein a critical current density of the filament in the superconducting joint is 5% to 80% of a critical current density of the filament in the niobium titanium superconducting wire in the portion other than the superconducting joint in a case where the critical current densities are measured in the same magnetic field intensity.

2. The superconducting circuit according to claim 1, wherein in the superconducting joint, the matrix of the niobium titanium superconducting wire is removed to expose the filament, and the exposed filament of the niobium titanium superconducting wire is tightly adhered together with an exposed filament of other superconducting wire within a uniting member.

3. The superconducting circuit according to claim 2, wherein the uniting member is a cylindrical member made of metal.

4. The superconducting circuit according to claim 2, wherein an occupation ratio of a volume of the filament occupying in an inner space of the uniting member to a volume of the inner space of the uniting member is 70 to 100%.

5. The superconducting circuit according to claim 2, wherein the uniting member is made of at least one of Cu, Al, Ag, Au, and Ni as a main composition.

6. The superconducting circuit according to claim 1, wherein the other superconducting wire is a niobium titanium superconducting wire.

7. A superconducting magnet provided with the superconducting circuit according to claim 1, comprising:

a superconducting joint that joints the niobium titanium superconducting wire constituting a superconducting coil or a persistent current switch and other superconducting wire.

8. The superconducting circuit according to claim 1, wherein a Vickers hardness of the filament in the superconducting joint is lower than the Vickers hardness of the filament in the niobium titanium superconducting wire in the portion other than the superconducting joint.

* * * * *